United States Patent
Abeles et al.

[11] Patent Number: 6,014,237
[45] Date of Patent: Jan. 11, 2000

[54] MULTIWAVELENGTH MODE-LOCKED DENSE WAVELENGTH DIVISION MULTIPLEXED OPTICAL COMMUNICATION SYSTEMS

[75] Inventors: Joseph Hy Abeles, Highland Park; John Charles Connolly, Clarksburg; William Edward Stephens, Belle Mead; Raymond Louis Camisa, East Windsor, all of N.J.

[73] Assignee: Sarnoff Corporation, Princeton, N.J.

[21] Appl. No.: 09/184,906

[22] Filed: Nov. 3, 1998

Related U.S. Application Data

[60] Provisional application No. 60/087,522, Jun. 1, 1998.

[51] Int. Cl.[7] .............................. H04J 14/02; H04J 4/00; H04J 14/00
[52] U.S. Cl. ..................... 359/124; 359/123; 359/130; 359/180; 359/173; 372/18
[58] Field of Search .................... 359/123–124, 359/133, 130, 132, 173, 180; 372/18

[56] References Cited

U.S. PATENT DOCUMENTS

| | | | |
|---|---|---|---|
| 3,849,604 | 11/1974 | Benes et al. ............................. | 179/15 |
| 4,807,227 | 2/1989 | Fujiwara .................................. | 370/3 |
| 4,873,681 | 10/1989 | Arthurs et al. ............................ | 370/3 |

(List continued on next page.)

OTHER PUBLICATIONS

Bellcore Technical Reference TR–NWT–000468, Reliability Assurance Practices for Optoelectronic Devices in Interoffice Applications (Bellcore, Livingston, NJ).

Cundiff, et al., "Effect of fiber nonlinearity on the propagation of highly chirped pulses in a WDM system," *OFC '98 Technical Digest,* Friday Morning, pp. 397–398.

Paper by Peter J. Delfyett, et al, "20+5Gbit/s optical WDM transmitter using a single–stripe multiwavelength modelocked semiconductor laser," pp. 1–10.

K. Hall, et al., "CMA2, Interferometric All–Optical Switching Using Nonlinearities in Semiconductor Optical Amplifiers Biased at Transparency," 1998 Conference on Lasers and Electro–Optics and published in the Optical Society of America.

Shi, et al., presentation entitled "Four–Wavelength, 10–Ghz Picosecond Pulse Generation From an Active Mode–Locked Single–Stripe Diode Laser," given May 20, 1997 at the 1997 Conference on Lasers and Electro–Optics.

Paper by M. R. Amersfoort et al., "Monolithic Multiwavelength Lasers for WDM Lightwave Systems" SPIE vol. 3006, pp. 134–144 1997.

*Primary Examiner*—Kinfe-Michael Negash
*Attorney, Agent, or Firm*—William J. Burke

[57] ABSTRACT

A multi-wavelength mode-locked dense wavelength division multiplexed (MWML-DWDM) optical transmission method and system including a MWML-DWDM optical transmitter having a multiwavelength mode-locked (MWML) laser which generates a wavelength-ordered repetitive periodic (WORP) sequence of discrete optical pulses for modulation with data carried by at least one electronic carrier. Signals from multiple telecommunications transmission interfaces are multiplexed together by a high speed electronic time domain multiplexer to form a single multiplexed high speed digital transmission stream that is encoded onto the optical pulse stream output by the MWML-DWDM optical transmitter by an optical modulator so as to provide multiple channels of information carried on a DWDM data stream over an optical fiber to a receiver where the data is received and decoded. A single MWML-DWDM optical transmitter and a single modulator may replace the numerous laser sources and associated modulators used in conventional WDM optical transmission systems. Wavelength usage may be further maximized by combining the outputs of several MWML-DWDM optical transmitters in the frequency domain using optical combiners or in the time domain using time division multiplexing techniques according to which DWDM wavelengths may be used more than once during a WORP-frame but only once during a pulse-frame. A single MWML laser source can provide hundreds of optical carriers.

29 Claims, 8 Drawing Sheets

U.S. PATENT DOCUMENTS

| | | | |
|---|---|---|---|
| 4,945,531 | 7/1990 | Suzuki | 370/3 |
| 5,005,167 | 4/1991 | Arthurs et al. | 370/4 |
| 5,113,459 | 5/1992 | Grasso et al. | 385/24 |
| 5,121,381 | 6/1992 | Takahashi et al. | 359/117 |
| 5,140,456 | 8/1992 | Huber | 359/341 |
| 5,166,821 | 11/1992 | Huber | 359/238 |
| 5,194,977 | 3/1993 | Nishio | 359/128 |
| 5,208,691 | 5/1993 | Nishio | 359/123 |
| 5,222,089 | 6/1993 | Huber | 372/26 |
| 5,278,686 | 1/1994 | Grasso et al. | 359/110 |
| 5,282,079 | 1/1994 | Laming et al. | 359/341 |
| 5,283,686 | 2/1994 | Huber | 359/337 |
| 5,321,540 | 6/1994 | Takai et al. | 359/124 |
| 5,347,525 | 9/1994 | Faris | 372/19 |
| 5,347,527 | 9/1994 | Favre et al. | 372/20 |
| 5,488,500 | 1/1996 | Glance | 359/127 |
| 5,493,433 | 2/1996 | Prucnal et al. | 359/123 |
| 5,495,356 | 2/1996 | Sharony et al. | 359/128 |
| 5,504,609 | 4/1996 | Alexander et al. | 359/125 |
| 5,506,710 | 4/1996 | Hamel | 359/115 |
| 5,532,864 | 7/1996 | Alexander et al. | 359/177 |
| 5,550,666 | 8/1996 | Zirngibl | 359/125 |
| 5,557,439 | 9/1996 | Alexander et al. | 359/130 |
| 5,559,624 | 9/1996 | Darcie et al. | 359/125 |
| 5,574,584 | 11/1996 | Darcie et al. | 359/125 |
| 5,587,830 | 12/1996 | Chraplyvy et al. | 359/341 |
| 5,600,742 | 2/1997 | Zirngibl | 385/37 |
| 5,623,356 | 4/1997 | Kaminow et al. | 359/123 |
| 5,627,925 | 5/1997 | Alferness et al. | 385/17 |
| 5,631,758 | 5/1997 | Knox et al. | 359/127 |
| 5,633,741 | 5/1997 | Giles | 359/124 |
| 5,654,816 | 8/1997 | Fishman | 359/177 |
| 5,673,129 | 9/1997 | Mizrahi | 359/124 |
| 5,673,342 | 9/1997 | Nelson et al. | 385/24 |
| 5,680,490 | 10/1997 | Cohen et al. | 385/24 |
| 5,694,234 | 12/1997 | Darcie et al. | 359/125 |
| 5,696,615 | 12/1997 | Alexander | 359/134 |
| 5,710,649 | 1/1998 | Mollenauer | 359/123 |
| 5,712,716 | 1/1998 | Vanoli et al. | 359/125 |
| 5,712,932 | 1/1998 | Alexander et al. | 385/24 |
| 5,712,936 | 1/1998 | Hoag et al. | 385/24 |
| 5,715,076 | 2/1998 | Alexander et al. | 359/130 |
| 5,719,696 | 2/1998 | Chraplyvy et al. | 359/341 |
| 5,726,784 | 3/1998 | Alexander et al. | 359/125 |
| 5,734,486 | 3/1998 | Guillemot et al. | 359/139 |
| 5,742,416 | 4/1998 | Mizrahi | 359/134 |
| 5,748,349 | 5/1998 | Mizrahi | 359/130 |
| 5,748,350 | 5/1998 | Pan et al. | 359/130 |
| 5,754,320 | 5/1998 | Watanabe et al. | 359/117 |
| 5,761,351 | 6/1998 | Johnson | 385/15 |
| 5,778,118 | 7/1998 | Sridhar | 385/24 |
| 5,784,184 | 7/1998 | Alexander et al. | 359/125 |
| 5,786,916 | 7/1998 | Okayama et al. | 359/128 |

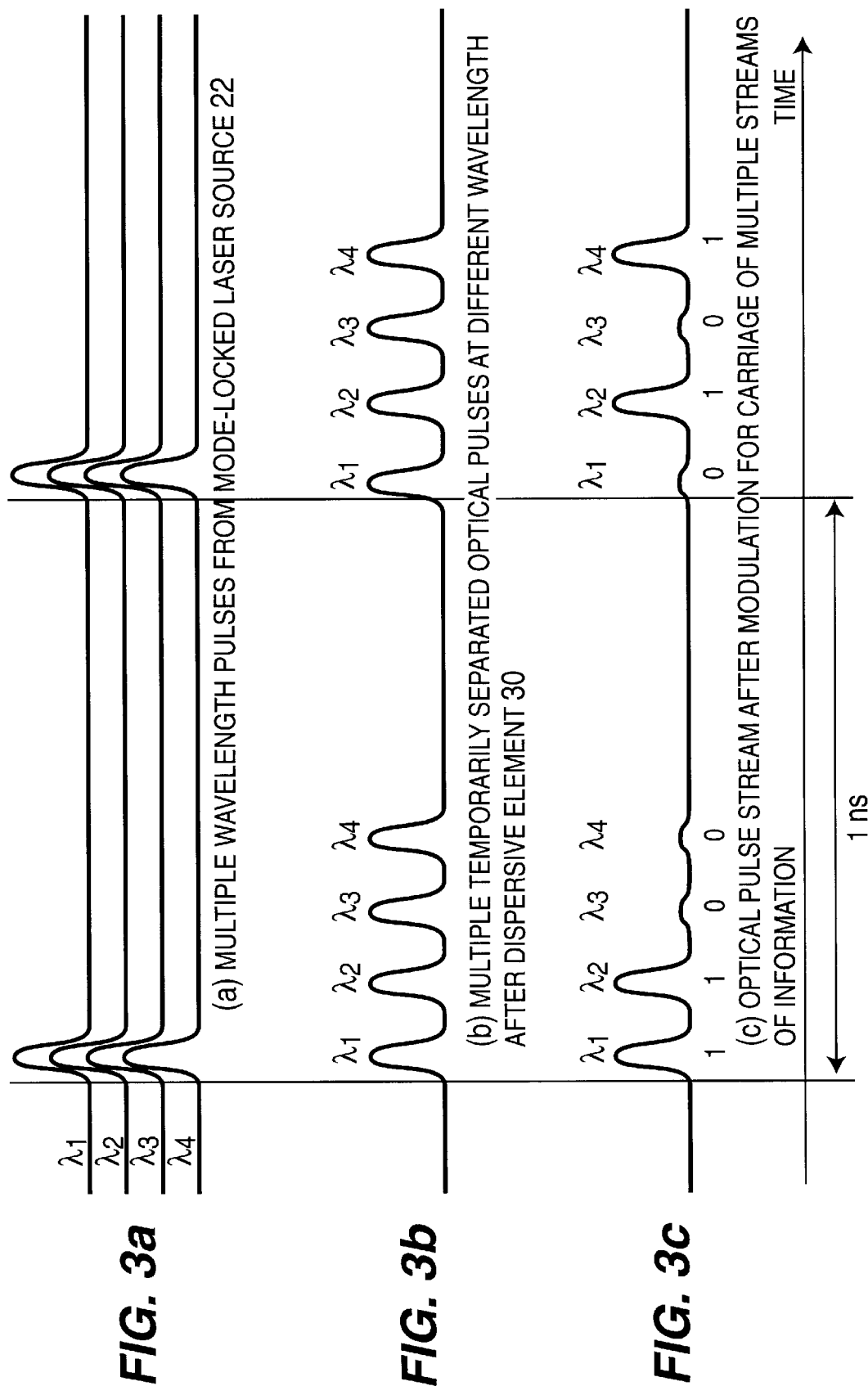

MULTIWAVELENGTH MODE-LOCKED DENSE WAVELENGTH DIVISION MULTIPLEXED OPTICAL COMMUNICATION SYSTEMS

CROSS-REFERENCE TO RELATED APPLICATIONS

The present application claims priority from U.S. Provisional Patent Application Serial No. 60/087,522, filed Jun. 1, 1998.

BACKGROUND OF THE INVENTION

1. Field of the Invention

The present invention relates to dense wavelength division multiplexed (DWDM) optical systems using multiwavelength mode-locked (MWML) lasers as light sources and, in a presently preferred embodiment, to architectures of DWDM optical communications systems using the outputs of MWML laser sources for the transport of data and telephony services.

2. Description of the Prior Art

There has been much research conducted over the years concerning the use of dense wavelength division multiplexing (DWDM) systems to increase the bandwidth of existing and emerging fiber optic transmission systems. As shown in FIG. 1, a conventional approach has been to use a plurality of stabilized laser diodes 10 operating at or near 1550 nm with wavelength separations of 0.4, 0.8, or 1.6 nm (frequency separations of 50, 100, or 200 GHz) where each laser diode 10 is modulated at rates between 155 Mb/s and 2.5 Gb/s by wideband external modulators 12. These modulated optical carriers, or optical data streams, are combined together using an optical combiner 14 to construct a higher bit-rate optical data stream that can be amplified by one or more wideband power amplifiers 16 and can be inserted into one single-mode optical fiber 18.

Conventional DWDM optical transmission systems of the type illustrated in FIG. 1 can transmit data of very high bit rates over conventional fiber optic lines. As is apparent from FIG. 1, such conventional DWDM optical transmission systems require a plurality of light sources 10 and data modulators 12. These components are expensive and complex, and the resulting multicomponent systems are exceedingly complex and expensive. A less expensive alternative is desired.

Recently, multiwavelength mode-locked (MWML) laser light sources have been developed which generate a plurality of pulses of different wavelengths in which each wavelength emits picosecond pulses at high rates. When a conventional pulse interleaving configuration including delay line units is included within such MWML laser sources, the output optical pulse train may be multiplexed to provide very high pulse rates at each wavelength, such as those which are suitable for DWDM transmission. A MWML laser source of this type has been described by Shi et al. at a presentation entitled "Four-Wavelength, 10-GHz Picosecond Pulse Generation From an Active Mode-Locked Single-Stripe Diode Laser" given May 20, 1997, at the 1997 Conference on Lasers and Electro-Optics, and described in an associated paper entitled "20×5 Gbit/s Optical WDM Transmitter Using a Single-Stripe Multiwavelength Modelocked Semiconductor Laser." Commercial embodiments of such a MWML laser source are described in commonly assigned U.S. patent application Ser. No. 09/191,218, filed Nov. 12, 1998 (Attorney Docket No. SAR 13170). As described therein, a single mode-locked laser, preferably an actively mode-locked semiconductor external cavity laser (AMSECL), emits a multiplicity of fundamental optical frequency components. An RF drive signal is provided to a semiconductor optical amplifier (SOA) situated within an optical resonator such as a Fabry-Perot cavity or ring resonator by a clock source so that the SOA amplifies mode-locked pulses periodically. The SOA preferably comprises an angled-stripe InGaAsP or GaAs/AlGaAs semiconductor optical traveling wave amplifier with facet reflectivities of substantially $10^{-6}$ or less. Such low reflectivity is necessary to keep the gain spectrum of the SOA free of undulations due to SOA Fabry-Perot modes which otherwise would interfere with the generation of multiple wavelengths, since some wavelengths would be emphasized while others would be muted by such undulations. Each fundamental optical frequency component is associated with its own unique set of additional frequency components such that each fundamental optical frequency and additional frequency components make up a unique wavelength band ("comb") of frequency components. As a result, a multiplicity of combs of optical frequency components is provided by the MWML laser source. In the time domain, the MWML laser source emits pulses of overall duration approximately equal to the inverse of the spectral width of each comb in the frequency domain.

Owing to the close wavelength spacing of the optical frequencies within a given comb, each comb may be considered as a single unique wavelength source for the purposes of DWDM systems.

In the aforementioned commonly assigned U.S. Patent Application, different embodiments of the MWML laser source are described, where each MWML laser source emits multiple discrete groups of wavelengths simultaneously in a short time interval, and each group is located at a wavelength suitable to DWDM optical transmission. Feedback or feedthrough optics modules are combined with gain modules to provide embodiments suitable for DWDM transmission. The optics are coupled to one or more ports of the amplifier in Fabry-Perot or optical ring resonator configurations to provide simultaneous feedback at the plurality of wavelengths and to provide substantially identical round-trip travel times and net gains within the lasing cavity for pulses at each output wavelength.

It is desired in accordance with the present invention to develop a DWDM optical transmission system using such MWML laser sources, so as to provide a DWDM optical transmission system which has far fewer components than conventional DWDM optical transmission systems and which has the potential for much larger bandwidths. The present invention has been developed for this purpose.

SUMMARY OF THE INVENTION

The above-mentioned needs in the art are met by a multiwavelength mode-locked dense wavelength division multiplexed (MWML-DWDM) optical transmission method and system including a MWML-DWDM optical transmitter having a multiwavelength mode-locked (MWML) laser source which generates discrete pulses at different frequencies of light for modulation with data carried by an electronic carrier. Signals from multiple electronic digital "sources," such as telecommunications transmission interfaces, are multiplexed by a high speed electronic time domain multiplexer (ETDM) to a higher bit-rate electronic data stream that is encoded by an optical modulator onto the optical pulse stream emitted by the MWML-DWDM optical transmitter so as to provide multiple channels of information carried on wavelength differentiated sets of digital data bits over an optical fiber to a receiver where the data is received and decoded. A single MWML-DWDM optical transmitter and a single modulator replace numerous laser sources and associated modulators used in conventional DWDM optical transmission systems. Wavelength usage may be further maximized by combining the outputs of several MWML-DWDM pulsed optical transmitters in the frequency domain or in the time domain.

A preferred embodiment of the MWML-DWDM optical transmission system of the invention is designed around a novel wavelength ordered repetitive periodic (WORP)-DWDM optical source comprising a MWML laser source and a temporal dispersion element.

A MWML laser source includes a semiconductor optical amplifier (SOA) disposed in the MWML laser source cavity which is actively driven by a radio frequency (RF) signal and emits periodic pulses within a plurality of discrete wavelength bands simultaneously at a port of the MWML laser source. The RF signal is chosen to oscillate at a frequency that substantially equals the inverse of the round trip travel time of pulses circulating within the cavity of the MWML laser source, or a harmonic thereof. In a preferred embodiment, the MWML laser source comprises an angled-stripe SOA and a RF source which applies the RF signal to the SOA.

The plurality of wavelengths of pulses output by the MWML laser source are then differentially time-shifted by the temporal dispersion element, such as a temporal dispersion filter or a dispersive fiber grating, which provides differential wavelength-dependent delays so as to transform the pulses emitted by the MWML laser source into a WORP sequence of optical pulses having several characteristics which lend themselves to the architecture of the invention.

It is a feature of such a WORP sequence that multiwavelength pulses are emitted periodically, such that the "period" from a pulse of one wavelength to a pulse of the next-emitted wavelength is substantially constant. This period between subsequent pulses is equal to the "repeat time" of the multiwavelength pulses emitted by the MWML laser source, divided by the number of wavelengths emitted by the MWML laser source. Therefore, the period between subsequent pulses is shorter than the repeat time between pulses of any given wavelength. The latter repeat time is equal to the repeat time of the multiwavelength pulses emitted by the MWML laser source. A WORP-DWDM source comprises such a MWML laser source and a temporal dispersion element.

In a WORP sequence, optical pulses are emitted sequentially according to their wavelength, such that the wavelength of subsequent pulses generally either increases monotonically or decreases monotonically with the exception that when an extreme wavelength is emitted such that the monotonic increase or decrease can no longer be supported by the available wavelength range emitted by the MWML laser source, the monotonic progression of wavelengths is interrupted such that the subsequent emitted pulse is of the opposite extreme in wavelength, after which the monotonic sequence is begun again.

In the context of discussion and specification of the characteristics of WORP optical pulse sequences and modulated WORP optical pulse sequences and for the purposes of this invention, a "pulse-frame" is the period of time during which a pulse of one wavelength is specified to be generated by a WORP-DWDM source, whereas a "WORP-frame" is the period of time during which a set of pulses of all wavelengths is specified to be generated by a WORP-DWDM source and generally refers to a set of such pulses of one of strictly monotonically increasing wavelength and strictly monotonically decreasing wavelength.

A MWML-DWDM optical transmitter may then be formed by further providing an optical modulator to modulate a digital data stream onto each individual wavelength in the WORP sequence of optical pulses emitted by the WORP-DWDM optical source. An ETDM is preferably used to drive a multiplicity of discrete electronic data signals into a single optical modulator for modulation onto the respective wavelengths in the WORP sequence. The output of the optical modulator is then amplified by an optical amplifier and optionally filtered by an etalon, or equivalent, filter known to those skilled in the art to accomplish one or both of narrowing the spectrum of each individual wavelength emitted from the optical modulator and of converting a shorter pulse return-to-zero (RZ) data modulation format to either a longer pulse RZ data modulation format or a non-return-to-zero (NRZ) data modulation format. The narrowing of spectrum caused by an etalon filter serves to mitigate wavelength dispersion in subsequent propagation of the optical pulses through optically dispersive media such as optical fiber. The etalon filter is employed in embodiments for which a receiver is not required to preserve the pulse-frame timing of the optical pulses.

The etalon filter, concomitantly, serves to increase the duration of WORP-DWDM optical pulses after they have been modulated by the optical modulator such that optical pulses of a given wavelength overlap optical pulses of another wavelength in time. The finesse of the etalon filter is accordingly chosen to increase pulse duration to a maximum at which optical pulses of a given wavelength begin to overlap pulses of the same wavelength in time but do not substantially interfere with the ability of a receiver to discriminate between subsequent pulses of a given wavelength. From a practical point of view, this maximum is characterized in the case of digital signals by the transition of the optical pulse sequence for a given wavelength from a RZ modulation format to a NRZ modulation format as these terms are known to those skilled in the art.

Alternatively, one or more ETDMs may be used to drive a multiplicity of discrete electronic data signals into several optical modulators for modulation onto the respective wavelengths in the WORP sequences output by each optical modulator.

In a presently preferred embodiment, the pulses emitted by the MWML laser source are split into at least two pulse sub-sequences containing a subset of wavelengths generated by the MWML laser source and an optical modulator is provided for each pulse sub-sequence. The splitting into sub-sequences may be performed by one of the methods of allowing for interleaving of wavelengths and allowing for segregation of wavelength bands in the multiplicity of pulse substreams. The purpose of the optical modulators is to modulate a digital optical data stream onto each individual wavelength in each pulse subsequence. An optical combiner combines the output of each of the optical modulators into a single aggregated multi-wavelength optical data stream for transmission. Since each path of each separate pulse sub-sequence imposes a delay on each pulse sub-sequence, the timing of pulses following combination of the outputs of the optical modulators can be adjusted based on the delays. The recombination of modulated substreams by the optical combiner may be performed in one of the ways of interleaving wavelengths and segregating wavelength bands of the modulated pulse substream emitted by each of the optical modulators.

Further, a plurality of MWML-DWDM transmission subsystems of this type may optionally be connected in parallel and their outputs combined by an optical combiner.

The above-mentioned embodiments are characterized in that a multiplicity of digitally modulated optical carriers, suitable for receipt by means of a wavelength-filtered standard digital optical receiver, is generated by a single MWML laser source in combination with passive optical or fiber optic components.

A MWML-DWDM pulsed optical receiver in accordance with the invention is little changed from a conventional DWDM optical receiver. A DWDM filter is provided to separate the modulated wavelength-sequential sequence into the original plurality of wavelengths, and a plurality of optical receivers demodulate the digital data stream from each of the plurality of wavelengths.

An alternate embodiment of a MWML-DWDM transmission method or system, which differs from a MWML-DWDM transmission method or system in certain aspects to be taught by the present invention, is the MWML-DWDM time-division-multiplexed (MWML-DWDM-TDM) transmission method or system. In a MWML-DWDM-TDM transmitter, a multiplicity of similarly modulated digital optical carriers is combined in such a manner as to require, in addition to wavelength filtering, time domain switching relying upon pulse-frame timing for reception of any given carrier by a corresponding MWML-DWDM-TDM receiver. In accordance with the invention, such TDM characteristics may be introduced to the transmitter without adding TDM circuitry by instead combining multiple WORP pulse sequences which can be derived from a single WORP-DWDM optical source in a time-shifted temporal order such that each WORP pulse sequence is shifted in time by one or more pulse-frames within the WORP-frame. In this case a wavelength may be modulated by more than one optical modulator to transmit data in a particular WORP-frame so long as no wavelength is used in any particular pulse-frame by the more than one optical modulator.

It is a feature of the MWML-DWDM-TDM transmitter that the multiple WORP pulse sequences required for a MWML-DWDM-TDM transmitter may be derived from a single WORP-DWDM pulse source by splitting the source and introducing progressive delays into arm of the split source, providing an advantage in reduction of the number of active optical components required in such a transmission system.

In contradistinction to a MWML-DWDM pulsed optical receiver, a MWML-DWDM-TDM receiver is distinguished from conventional DWDM optical receivers in that pulse-frame time must be preserved.

The scope of the invention also includes MWML-DWDM transmission methods implemented using the circuitry described herein.

BRIEF DESCRIPTION OF THE DRAWINGS

The present invention will be better understood after reading the following detailed description of the presently preferred embodiments thereof with reference to the appended drawings, in which:

FIGS. 3(a)–3(c) illustrate four of the pulses of varying wavelength contained within the optical signal emitted by the WORP-DWDM optical source of FIG. 2 before (FIG. 3(a)) and after (FIG. 3(b)) the pulsed light has passed through the temporal dispersion filter or grating and been transformed into a WORP sequence of optical pulses suited for modulation with multiple streams of data (as shown in FIG. 3(c)).

DETAILED DESCRIPTION OF THE PREFERRED EMBODIMENTS

Figure 1:
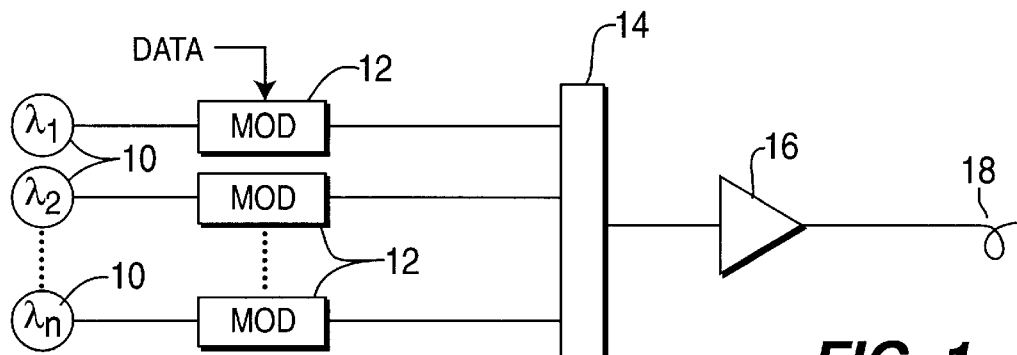
FIG. 1 is a schematic diagram of a conventional DWDM optical transmitter which requires a plurality of light sources and modulators, one for each optical carrier.

A system and method which meets the above-mentioned objects and provides other beneficial features in accordance with presently preferred exemplary embodiments of the invention will be described below with reference to FIGS. 2–12. Those skilled in the art will readily appreciate that the description given herein with respect to those figures is for explanatory purposes only and is not intended in any way to limit the scope of the invention. Throughout the description, like reference numerals will refer to like elements in the respective Figures.

The present invention provides multiwavelength mode-locked dense wavelength-division-multiplexed (MWML-DWDM) optical transmission systems, preferably, though not necessarily, including a dense wavelength-division-multiplexed (DWDM) optical transmitter having a multi-wavelength mode-locked (MWML) laser source which generates discrete pulses at different frequencies of light for modulation with data carried by an electronic carrier via a high speed electronic time domain multiplexer (ETDM). In a presently preferred telecommunications embodiment, the MWML-DWDM optical transmitter may be connected to multiple telecommunications transmission interfaces, such as Synchronous Optical Network (SONET) Optical Carrier (OC) interfaces over the entire SONET hierarchy including 155.52 Mbps (SONET OC-3), 622.080 Mbps (SONET OC-12), 2.488 Gbps (SONET OC-48), 10 Gbps (SONET OC-192) or T-carrier interfaces DS-1 (1.544 Mbps) and DS-3 (44.736 Mbps), or data networking interfaces including IEEE 802.3 (Ethernet), 10-Base T Ethernet, 100-Base T Ethernet, Gigabit Ethernet, FDDI, Fibre Channel, ESCON, IEEE 802.5 (Token Ring), and others. Generally, multiple signals from these interfaces are electronically multiplexed together by an ETDM to form a single high bit-rate digital transmission stream that is used to modulate a wavelength ordered repetitive periodic (WORP) optical multiwavelength pulse stream coming from the WORP-DWDM source comprising a MWML laser source and temporal dispersion element. As will be explained in more detail below, at least one optical modulator device is used to encode the multiplexed signal onto at least one WORP pulse stream such that it appears at the output of the MWML-DWDM optical transmitter to provide multiple channels of information carried on a wavelength-coded set of modulated pulses over an optical fiber to a receiver where the wavelength-coded data is received and decoded.

Wavelength-Ordered Repetitive Periodic DWDM Optical Source

Figure 2:
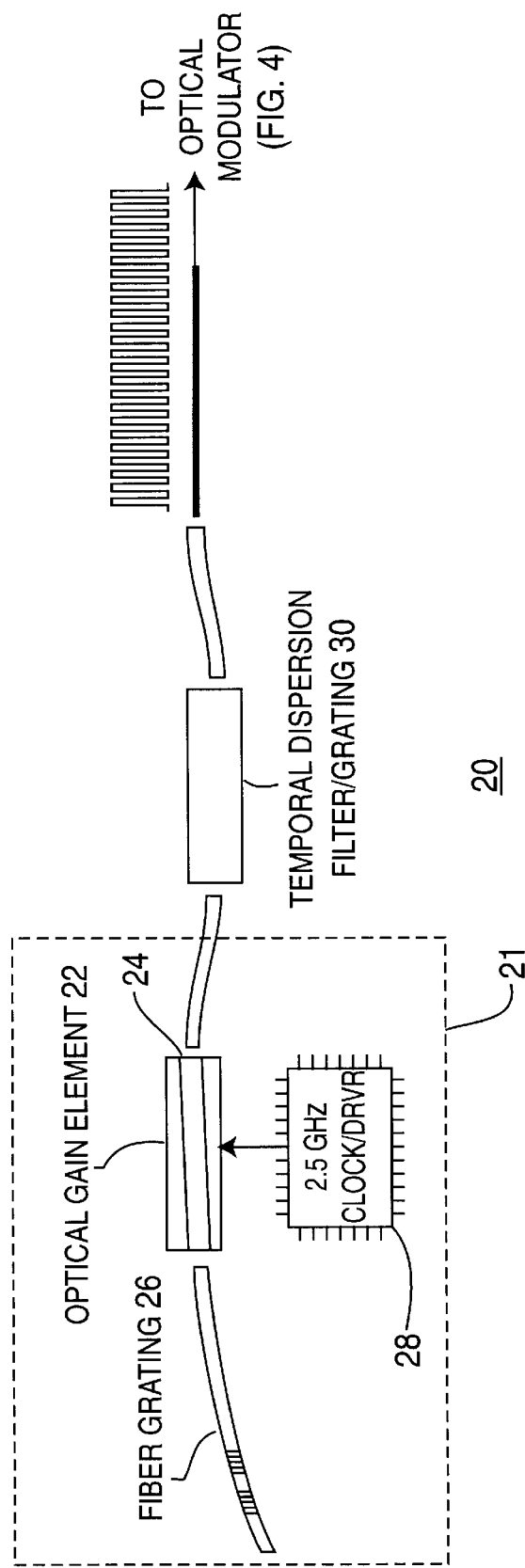
FIG. 2 is a schematic diagram of an embodiment of a WORP-DWDM optical source comprising a single MWML laser source and a temporal dispersion filter or grating for use in the MWML-DWDM transmission systems of the invention.

FIG. 2 illustrates an embodiment of a WORP-DWDM optical source 20 for use in a simple integrated high performance MWML-DWDM optical transmission system in place of the complex prior art multicomponent DWDM optical transmission system schematically shown in FIG. 1. As shown, the WORP-DWDM optical source 20 includes a MWML laser source 21 of the type described in the above-mentioned commonly assigned patent application. In the embodiment of FIG. 2, the MWML laser source 21 preferably comprises an angled-stripe InGaAsP or GaAs/AlGaAs SOA or other optical gain element 22 for use as a gain element in a mode locked external cavity laser system. In the embodiment of FIG. 2, one mirror of the MWML laser source 21 is a facet 24 of the optical gain element 22 while the other mirror is a fiber grating 26 that preferentially reflects discrete wavelengths so as to provide simultaneous feedback at the plurality of wavelengths and to provide substantially identical round-trip travel times and net gains within the lasing cavity for pulses at each output wavelength. The optical gain element 22 is biased by both a DC signal and a RF signal from a CW RF source 28 so that the optical gain element 22 amplifies periodic pulses at a plurality of wavelengths simultaneously. Generally, this is accomplished by selecting an RF signal which has a frequency or a sub-harmonic that substantially equals the inverse of the round trip travel time of pulses circulating within the cavity of the MWML laser source 21. As shown in FIG. 2, the optical signal emitted by MWML laser source 21 is passed through a temporal dispersive device, such as a dispersion filter or dispersive fiber grating 30, and the optical signal is thereby transformed into a WORP sequence of pulses that occurs in a periodic sequence, where each pulse within the WORP-frame has a different wavelength. Individual pulses emitted by the MWML laser source 21 may be intentionally or unintentionally chirped, as the term is known to those skilled in the art, within the MWML laser source 21, such that their duration may be reduced or increased by application of dispersion by the temporal dispersion filter or grating 30 depending on the sign of said dispersion. In accordance with the invention, the sign of temporal dispersion employed to generate the WORP sequence of pulses from the MWML laser source is selected so as to reduce the duration of the pulses. The result is a MWML pulse stream having wavelengths corresponding to DWDM channels of bit rates of, e.g., 2.5 Gbits/sec each.

Unlike a conventional mode-locked laser, the MWML laser source 21 simultaneously emits many pulses of discrete wavelengths which are subsequently converted into such a WORP pulse stream. In contradistinction to conventional mode locked lasers, such as those employed by the system of Gregory W. Faris described by U.S. Pat. No. 5,347,525 entitled "Generation of Multiple Stabilized Frequency References Using a Mode-Coupled Laser" and another described by Wayne H. Knox and Martin C. Nuss in U.S. Pat. No. 5,631,758 entitled "Chirped-Pulse Multiple Wavelength Telecommunications System," the MWML laser source 21 of the invention emits periodic pulses within a plurality of discrete wavelength bands whose aggregate spectral bandwidth is equal to or greater than that of a single wavelength component, times the number of wavelengths emitted. Accordingly, and by way of example, a single 1550-nm-wavelength MWML laser source would be capable of providing optical carriers sufficient to support DWDM channels over 32 nm of optical bandwidth, without being required to emit pulses of duration less than 10 psec (FWHM), whereas such pulses would only support channels over merely 0.32 nm in the case of the conventional mode-locked laser system architectures cited above.

MWML laser source 21 simultaneously emits a multiplicity of pulses each of discretely different wavelength during each MWML laser source period, i.e., during each WORP-frame, so as to form the basis for an advanced MWML-DWDM optical transmission system in accordance with the invention. By addition of dispersive element 30, the MWML laser source 21 is transformed into a WORP-DWDM optical source 20 that emits sequential pulses of discrete wavelength, where the temporal pattern of pulses resembles a rainbow, albeit at infrared wavelengths. For example, a 16-wavelength WORP-DWDM optical source 20 might emit 10-psec full-width half maximum pulses in the repeating periodic temporal sequence of $\lambda_1, \lambda_2, \lambda_3, \lambda_4, \lambda_5, \lambda_6, \lambda_7, \lambda_8, \lambda_9, \lambda_{10}, \lambda_{11}, \lambda_{12}, \lambda_{13}, \lambda_{14}, \lambda_{15}, \lambda_{16}, \lambda_1, \lambda_2, \lambda_3, \lambda_4, \lambda_5, \ldots$ such that $\lambda_1 > \lambda_2 > \lambda_3 > \lambda_4 > \lambda_5 > \lambda_6 > \lambda_7 > \lambda_8 > \lambda_9 > \lambda_{10} > \lambda_{11} > \lambda_{12} > \lambda_{13} > \lambda_{14} > \lambda_{15} > \lambda_{16}$ are the wavelengths of pulses emitted by the MWML laser source 21. In this sequence, the time allocated uniquely for emission of a single pulse of one wavelength is termed a "pulse-frame," which also corresponds to the interval between subsequent pulses of differing wavelength. The time allocated for emission of the sequence of pulses $\lambda_1, \lambda_2, \lambda_3, \lambda_4, \lambda_5, \lambda_6, \lambda_7, \lambda_8, \lambda_9, \lambda_{10}, \lambda_{11}, \lambda_{12}, \lambda_{13}, \lambda_{14}, \lambda_{15}, \lambda_{16}$, is termed a "WORP-frame." The dispersion element 30, by introducing a differential wavelength-dependent delay, transforms the output of the MWML laser source 21, four wavelengths of which are shown in FIG. 3(a), into a WORP sequence, as partially shown in FIG. 3(b) for the four wavelengths of the MWML laser source 21 of FIG. 3(a). As illustrated, each wavelength component is delayed by dispersion element 30 by a duration such that, at the input to an optical modulator, the pulses cycle once during each WORP-frame and do not temporally overlap to a great extent. FIG. 3(*c*) illustrates the partial WORP sequence of FIG. 3(*b*) after it has been modulated with streams of data [1100] and [0101] during respective pulse-frames by such an optical modulator.

It is a characteristic of the WORP-DWDM source of the invention that the length of its WORP-frame and the number of wavelengths determine the duration of its characteristic pulse-frame. The duration of a pulse-frame determines the optical frequency band occupied by pulses. For transform-limited pulses the product of the gaussian full-width half maximum pulse duration and the gaussian full-width half maximum optical frequency spectrum is substantially equal to 0.4413. For a non-transform-limited pulse this product is larger. The generation of a greater multiplicity of wavelengths within the WORP-DWDM source for a given WORP-frame duration is associated with the use of a greater portion of optical frequency spectrum for each individual wavelength. Accordingly, the spacing between adjacent wavelengths is greater for WORP-DWDM sources that employ a greater number of wavelengths for a given WORP-frame. In general, it may be desirable to employ narrow wavelength spacings. Accordingly, it is a feature of the present invention that the multiple WORP-DWDM sources can be employed to alleviate this limitation, as taught below for interleaving of wavelengths deriving from multiple WORP-DWDM sources within the context of the DWDM optical transmitter architectures of the invention.

Multi-Wavelength Mode-Locked DWDM Optical Transmitter Embodiments

Figure 4:
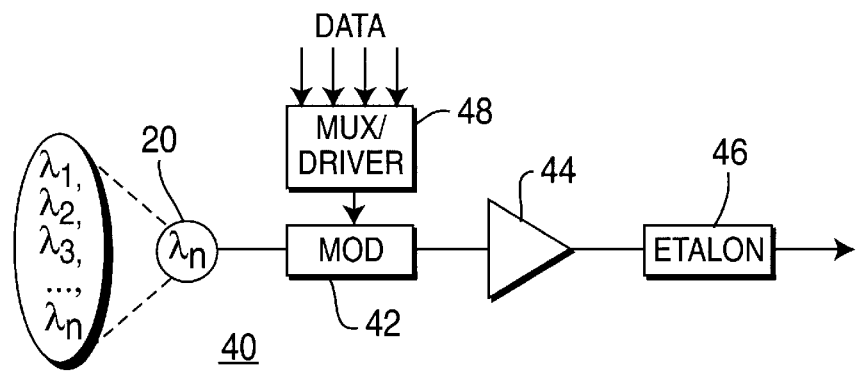
FIG. 4 is a schematic diagram of an embodiment of a MWML-DWDM optical transmitter which requires only a single WORP-DWDM optical source and modulator in accordance with the invention.

The WORP-DWDM optical source 20 of FIG. 2 using MWML laser sources of the type described in U.S. patent application Ser. No. 09/191,218, filed Nov. 12, 1998 (Attorney Docket No. SAR 13170) may be used to form a MWML-DWDM optical transmitter 40 by adding a high-speed optical modulator 42 which impresses digital data upon each individual wavelength in the output pulse sequence and by adding an optical amplifier 44 as shown in FIG. 4. An etalon 46, or equivalent, filter known to those skilled in the art may also be used to accomplish one or both of narrowing the spectrum of each individual wavelength emitted from the optical modulator 42 to mitigate dispersion for long distance transmission or in any application for which dispersion is a critical issue and of converting a shorter pulse data return-to-zero (RZ) modulation format to one of a longer pulse RZ modulation format and a non-return-to-zero (NRZ) modulation format.

In addition to the components shown in FIGS. 2 and 4, electronic components are required to drive the MWML-DWDM optical transmitter 40 of the invention. For example, a high-speed digital electronic time domain multiplexer (ETDM) 48 is employed to combine a number of lower-speed signals, one for each wavelength, into the combined data signal for driving the optical modulator 42. For example, if 16 signals, each of 2.5 Gbit/sec, are combined, they will create a 40 Gbit/sec signal for input into the optical modulator 42. High-speed modulation electronics capable of 40 Gbit/sec rates have been demonstrated by Rockwell and others, and other suitable high-speed modulators 42 are known to those skilled in the art. Yet higher speed modulators and electronic multiplexers are anticipated to become available in the near future.

A significant advantage may be obtained by a combination of multiple lower-rate data streams on multiple wavelength optical carriers by means of the MWML-DWDM optical transmitter 40 of the invention, in that the number of optical components required to transmit these multiple data streams is significantly reduced. For example, in the prior art, a separate printed circuit board module is required for each individual wavelength stream to be transmitted in a DWDM optical transmission system, whereas in the present invention a single printed circuit board module would be capable of transmitting, e.g., 16 or 32 different DWDM signals. Moreover, only a single modulator is required to code many data streams, while the resulting DWDM optical signal remains compatible with standard optical receiver terminal equipment. As will be explained below, a plurality of MWML-DWDM optical transmitters may further be arranged in parallel to form a high performance transmitter by optically combining the outputs of each transmitter.

As an additional advantage, a single optical gain element such as SOA 22 provides optical gain for all wavelength signals, mitigating reliability issues associated with multiple laser sources employed in prior art DWDM systems. Also, wavelength is determined only by passive components, mitigating reliability issues associated with active circuit components. In addition, only a single active source needs to be stocked to correct any failures, as opposed to different sources for each different WDM wavelength in systems as currently deployed.

Modulator speed is limited by the ability to bias at maximum bit rates both the full "on" and full "off" states. However, those skilled in the art will appreciate that modulators and associated driving and equalizing electronics are generally limited by the product of modulation amplitude and speed of modulation, and thus can be used at bit rates higher than their nominal bit rate for full on-off operation in a modulator 42 biased at extinction by modulating only to a partial-on condition. The optical power thus sacrificed can be made up by the optical amplifier 44 following the modulator 42. Therefore, the aggregate bit rate of the MWML-DWDM optical transmitter 40 of the invention is understood to be limited ultimately by the maximum speed of the digital ETDM 48 and its associated electronic components.

Additional electronic components required may include amplifiers and equalizers necessary to drive the high-speed modulator 42, components to effect clock generation, stabilization, and distribution between the digital ETDM 48, and the WORP-DWDM optical source 20, and components to provide RF drive to the SOA 22 within the MWML laser source 21. In addition to these electronic components, optical amplification may be included prior to the optical modulation according to system requirements and trade-offs. In addition to these electronic and optoelectronic components, a complete MWML-DWDM optical transmitter 40 in accordance with the invention will require control electronics and software control functionality enabling it to function as part of a digital optical transmission network. Such apparatus and methods are well known to those skilled in the art and will not be discussed in further detail here.

Figure 5:
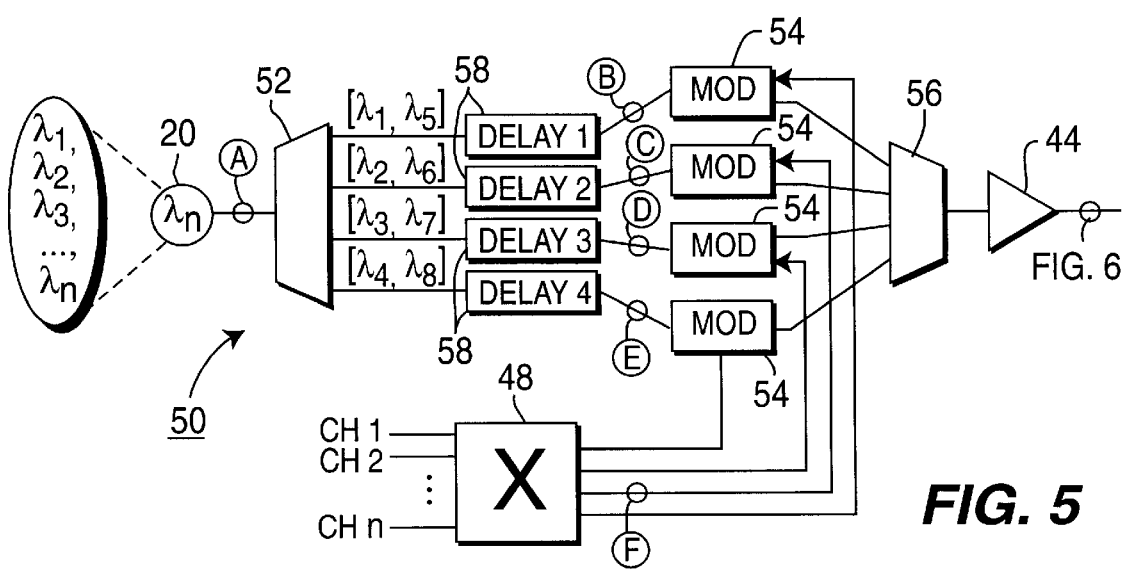
FIG. 5 is a schematic diagram of an embodiment of a MWML-DWDM optical transmitter employing a four-way splitting, modulation, and recombination process for multiplying the data rate output of a MWML-DWDM optical transmitter of the type illustrated in FIG. 4.

In a presently preferred embodiment of the MWML-DWDM optical transmitter of the invention, it is desirable to generate higher modulation rates than may be conveniently or economically generated by available components in the embodiment of FIG. 4, with or without the bit rate enhancement technique described above involving partial "on" biasing of the optical modulator. In such circumstances, it is possible to employ a multiplicity of modulators associated with respective portions of the pulse stream emitted by the WORP-DWDM optical source 20 of the invention so as to exceed the limitations of the modulation rate of a particular modulator. For example, the data rate is multiplied by the number of modulators when multiple modulators are used. FIG. 5 illustrates a presently preferred embodiment of a MWML-DWDM pulsed optical transmitter 50 in which a WORP pulse sequence, A, emitted by the WORP-DWDM pulsed optical source 20, is divided by splitter 52 into multiple pulse streams.

By way of example, FIG. 5 shows the WORP optical pulse sequence, A, consisting of 8 different wavelengths, $\lambda_1$, $\lambda_2$, $\lambda_3$, $\lambda_4$, $\lambda_5$, $\lambda_6$, $\lambda_7$, $\lambda_8$, where optical pulse sequence, A, is split into four WORP optical pulse sub-sequences such that the first WORP optical pulse sub-sequence carries pulses with wavelengths $\lambda_1$, $\lambda_5$, the second WORP optical pulse sub-sequence carries pulses with wavelengths $\lambda_2$, $\lambda_6$, the third WORP optical pulse sub-sequence carries pulses with wavelengths $\lambda_3$, $\lambda_7$, and the fourth WORP optical pulse sub-sequence carries pulses with wavelengths $\lambda_4$, $\lambda_8$. Each WORP optical pulse sub-sequence may be independently modulated by electronic data from a switch or digital ETDM 48 using an optical modulator 54, and the resulting modulated WORP optical data sub-streams recombined by optical combiner 56 to form a higher speed WORP optical data stream employing all original 8 different wavelengths. As illustrated, the digital ETDM 48 may provide a separate electronic data stream to each optical modulator 54. By imposing the correct delay element 58 on WORP optical pulses before or after the modulators 54, the timing following recombination can be adjusted to obtain a WORP optical data stream identical to that emitted by a single MWML-DWDM optical transmitter 40 employing a single modulator 42 except that lower speed electronics and slower modulation speeds are necessary. The relative delays of the four WORP optical pulse substreams for a given aggregate data rate are determined by the differing lengths of the fibers over which they are guided, or by similar methods known to those skilled in the art. Those skilled in the art will also appreciate that the delays may all have identical durations or some other adjustable duration to ensure pulses are recombined in the correct timing sequence as in the original WORP optical stream.

Figure 7A:
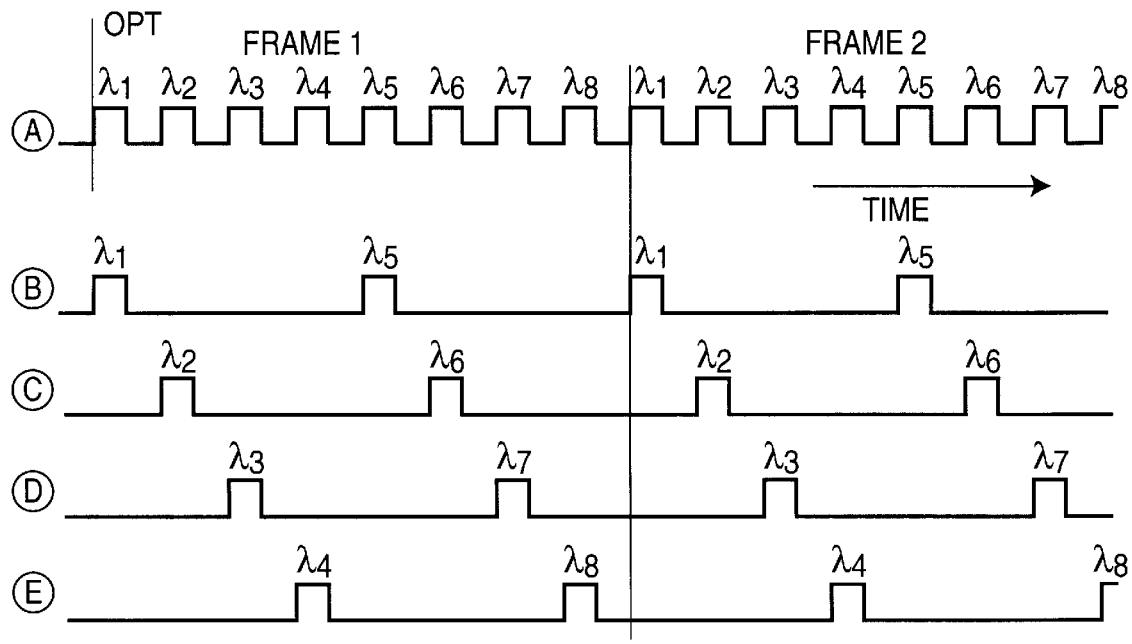
FIG. 7(a) illustrates optical signals from the embodiment of FIG. 5 before modulation is stamped on the different wavelengths.
Figure 7B:
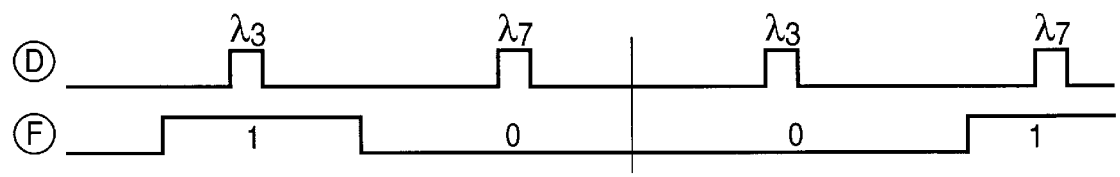
FIG. 7(b) illustrates the encoding of $\lambda_3$ of FIG. 7(a) with the two bit sequence [10] and the encoding of $\lambda_7$ with the two bit sequence [01].

FIG. 7(a) illustrates optical signals from the MWML-DWDM pulsed optical transmitter 50 of FIG. 5 at the indicated points A–E before modulation is stamped on the different wavelengths. FIG. 7(b) illustrates the encoding of $\lambda_3$ of FIG. 7(a) with the two bit sequence [10] and the encoding of $\lambda_7$ with the two bit sequence [01]. As illustrated, the data signal may have a relatively longer switching cycle than the light pulse.

Figure 8:
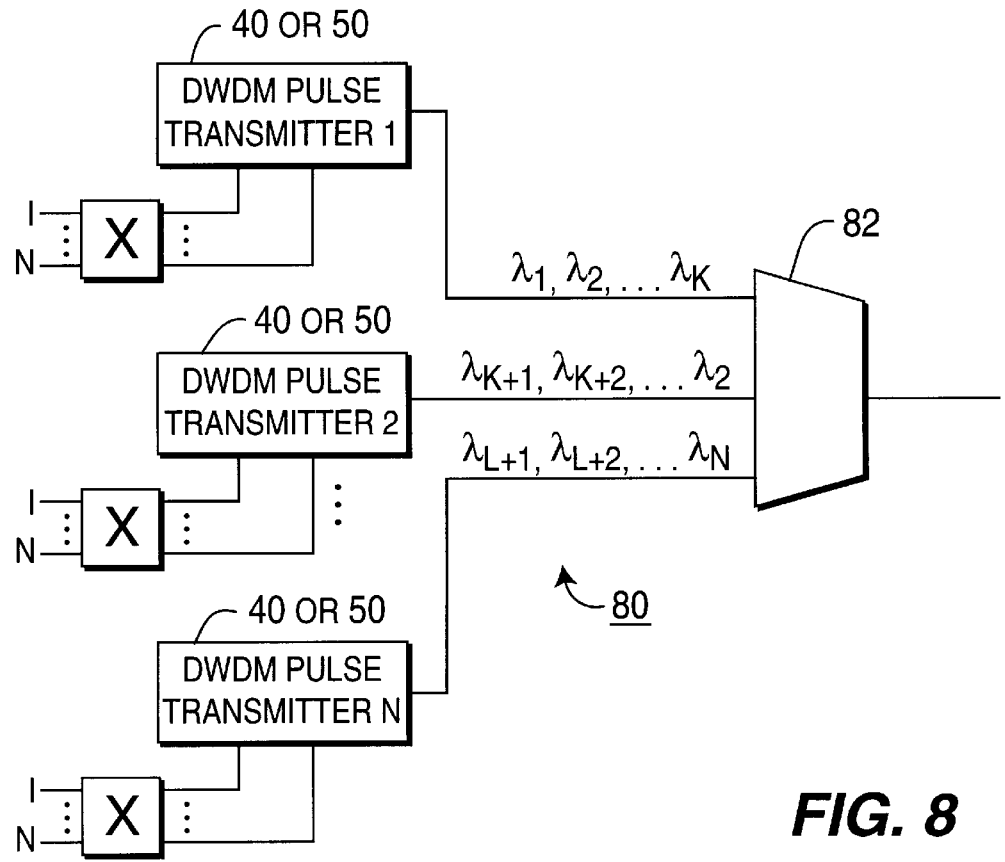
FIG. 8 is a schematic diagram of an embodiment in which a plurality of DWDM optical sources of the type illustrated in FIGS. 4 and 5 are connected in parallel and their outputs combined by an optical combiner so as to output a discrete non-overlapping set of wavelengths each of which represents a separate channel thereby increasing the bandwidth in accordance with the invention.

FIG. 8 illustrates an embodiment of a MWML-DWDM optical transmitter 80 in accordance with the invention in which a plurality of MWML-DWDM optical transmitters 40 or 50 are disposed in parallel and their outputs combined by an optical combiner 82 to provide further increased throughput. In this embodiment, the outouts of the respective MWML-DWDM optical transmitters 40 or 50 are placed in respective order whereby the output of MWML-DWDM transmitter 1 is in the wavelength order $\lambda_1, \lambda_2, \ldots \lambda_K$, the output of MWML-DWDM transmitter 2 is in the wavelength order $\lambda_{K+1}, \lambda_{K+2}, \ldots, \lambda_L$, and the output of MWML-DWDM transmitter N is in the wavelength order $\lambda_{L+1}, \lambda_{L+2}, \ldots \lambda_N$. In this case the wavelengths are such that $\lambda_1 < \lambda_2 < \ldots < \lambda_K < \lambda_{K+1} < \lambda_{K+2} < \ldots < \lambda_{L+1} < \lambda_{L+2} < \ldots < \lambda_N$. This illustrative example is one of many; the primary requirement is that the wavelengths associated with MWML-DWDM transmitter 1 are not the same as those associated with MWML-DWDM transmitter 2 through MWML-DWDM transmitter N. Similarly the wavelengths associated with MWML-DWDM transmitter 2 are not the same as those associated with MWML-DWDM transmitter 1 and MWML-DWDM transmitter 3 through MWML-DWDM transmitter N.

Figure 6A:
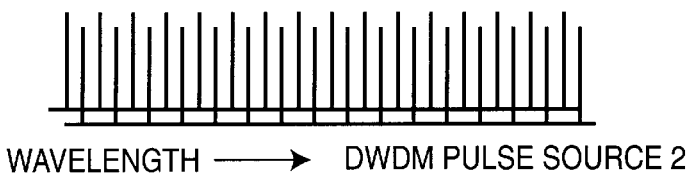
FIGS. 6(a) and 6(b) illustrate the combination of the outputs of two modulators in the embodiment of FIG. 5 by interleaving wavelengths (FIG. 6(a)) and by segregating wavelength bands (FIG. 6(b)).
Figure 6B:
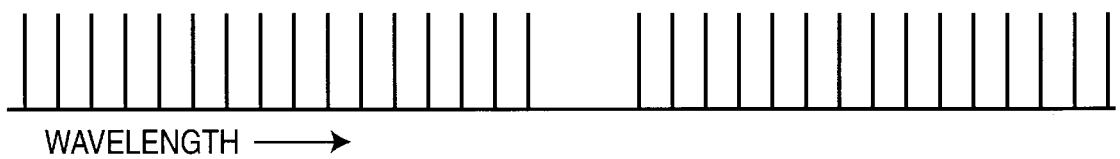

As shown in FIG. 6(a), optical combiner 82 may interleave the wavelengths from the respective modulators. Alternatively, optical combiner 82 may segregate the wavelength bands as shown in FIG. 6(b). An advantage of segregation of wavelength bands is that it provides for a reduced degree of temporal dispersion required by the system. In general, the degree of temporal dispersion may be limited by the broadening of individual pulses, which is limited by channel crosstalk considerations.

Those skilled in the art will appreciate that a large number of wavelengths can be generated with the MWML-DWDM optical transmitter 50 and 80 such that the number of wavelengths is ultimately limited only by the availability of optical spectrum. The transmitter embodiments of FIGS. 5 and 8 also have the benefit that they require relatively low speed electronics/optical train (e.g., 2.5 Gbps or 10 Gbps electronics instead of 40 Gbps) and less cost since each optical modulator 54 is used to encode more than one wavelength.

Multi-Wavelength Mode-Locked DWDM-Time-Division-Multiplexed Optical Transmintter Embodiment In accordance with the invention, it is desirable to use time division multiplexing (TDM) to add more data channels without adding more wavelengths. In accordance with the invention, the outputs of several MWML-DWDM optical transmitters of the type described above or several known DWDM optical transmitters may be combined using time division multiplexing (TDM) techniques without the addition of TDM components at the transmitter.

Figure 9:
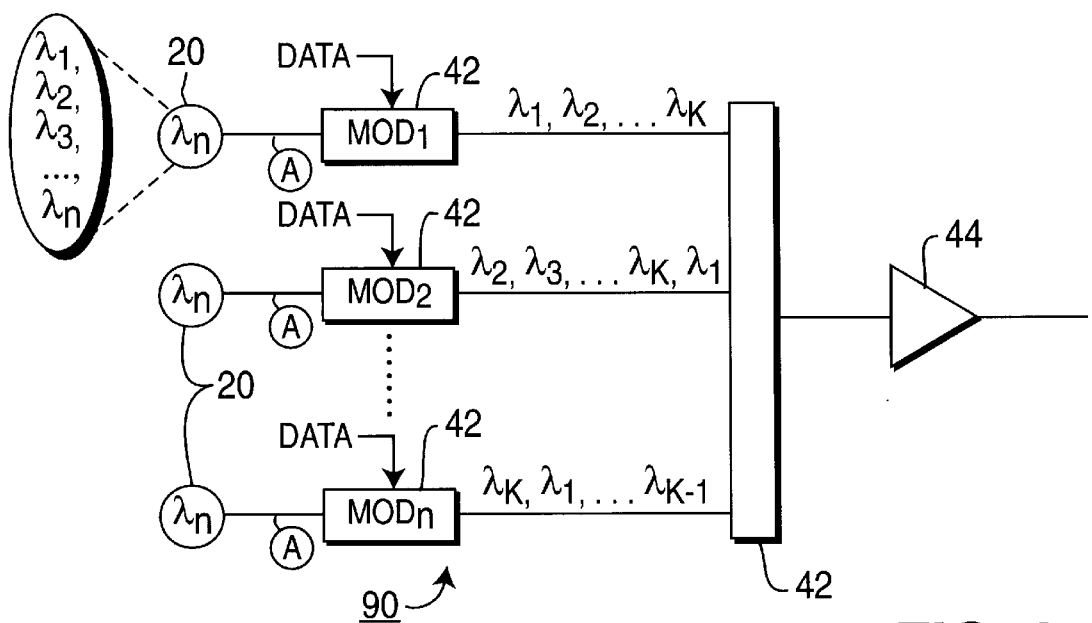
FIG. 9 is a schematic diagram of an embodiment of a MWML-DWDM optical transmitter which uses time division multiplexing (TDM) techniques with a plurality of MWML-DWDM optical transmitters of the type illustrated in FIGS. 4 and 5 to provide a MWML-DWDM-TDM optical transmitter in accordance with the invention.

For example, as shown in FIG. 9, a MWML-DWDM-TDM optical transmitter 90 may be formed by providing a plurality of MWML-DWDM optical transmitters 40 or 50 of the type described in FIGS. 4 and 5 including WORP-DWDM pulsed optical sources 20 and modulators 42 connected in parallel, optical combiner 92, and an optical amplifier 44. In this embodiment, however, the WORP data streams emitted by the respective modulators 42 are time shifted with respect to each other so that the same wavelengths are not used more than once during the same pulse-frame in different channels of optical data output by the respective MWML-DWDM optical transmitters 40 or 50. In other words, a given wavelength may be used many times during a single WORP-frame to modulate data in different channels so long as it is not used more than once in a given pulse-frame. Since the number of pulse-frames occurring during each WORP-frame is equal to the number, N, of wavelengths, the number of optical carriers transmitted once during each WORP-frame may be increased from N, in the case of a MWML-DWDM transmission system of the invention, to $N^2$, in the case of a MWML-DWDM-TDM transmission system of the invention, for the same WORP-frame.

In accordance with the invention, the several MWML-DWDM optical transmitters thus combined to create a MWML-DWDM-TDM transmitter may rely on a single WORP-DWDM source shared in common among them all.

The increase in data rate for the MWML-DWDM-TDM system architecture is accomplished by more fully using the available optical frequency spectrum, i.e., by transmitting the wide bandwidth associated with short, e.g., 5–10 psec FWHM, pulses and not reducing their bandwidth by the use of an optical filter such as an etalon as taught above for use with a MWML-DWDM transmission system. Such an embodiment relies on a combination of wavelength division multiplexing and ultrafast time division multiplexing in a manner which is better illustrated in FIG. 10.

Figure 10:
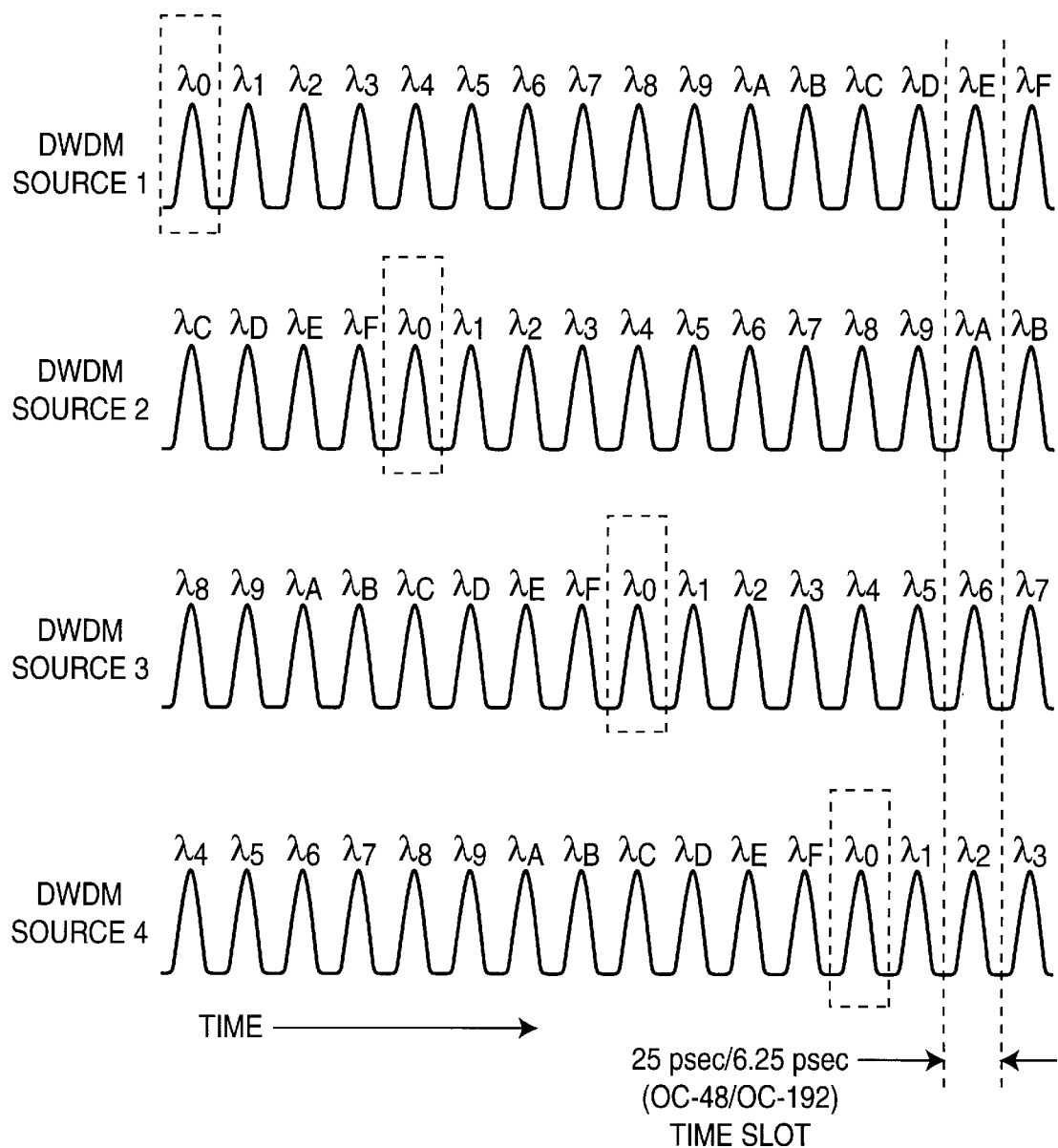
FIG. 10 illustrates the temporal displacement effect of multiple WORP sequences of optical pulses within the MWML-DWDM-TDM optical transmitter of FIG. 9.

FIG. 10 illustrates a 16 wavelength example taken at point A of FIG. 9 for four WORP optical pulse sequences. For purposes of illustration, each pulse is labeled according to its wavelength for discussion purposes, is unrelated to any other pulse, and each pulse represents a separate data channel, subject to electro-optic modulation with data. If there are 16 wavelengths and 16 pulse-frames, 256 different data streams can be carried by the system represented by FIG. 9 without temporal overlap of wavelengths in different channels. FIG. 10 shows that, when multiple pulse streams are combined in a optical combiner 92, the pulses of a given wavelength in one stream do not temporally overlap with pulses of that wavelength in any other stream. For example, the same 16 wavelengths ("0"–"F") would repeat in each channel and occur in each pulse-frame but in different WORP optical pulse sequences at different times. As shown in FIG. 10, the pulses of wavelength $\lambda_0$ occur in the first pulse-frame for the WORP optical pulse sequence from WORP-DWDM source 1, in the fifth pulse-frame for the WORP optical pulse sequence from WORP-DWDM source 2, and so forth. While only four WORP optical pulse sequences are shown, the maximum number of four WORP optical pulse sequences is equal to the number of different wavelengths, N. Thus, in the example where 16 wavelengths marked $\lambda_0$ through $\lambda_F$ in hexadecimal format are shown, 16 different four WORP optical pulse sequences may be employed. As illustrated with respect to the fifteenth pulse-frame of FIG. 10, as marked by the two vertical dotted lines, no two wavelengths appear twice in pulse-frame. The same is true for any pulse-frame. By arranging the wavelengths temporally as well as by frequency, TDM switching techniques may be used to select a pulse-frame and then to select any given wavelength within that pulse-frame using DWDM filtering techniques, thereby expanding the throughput of the system.

TDM switching techniques have been developed which may be incorporated into MWML-DWDM-TDM receiver circuitry to separate the wavelength channels. Electro-optic modulators have been demonstrated with 100 GHz 3-dB bandwidths, and commercial units with 40 GHz bandwidths, capable of switching 12.5 psec pulses electronically at their rated bandwidths are sold by Sumitomo Cement, Inc. As noted above, the maximum operating speed of such modulators may be traded-off against attentuation, so that significantly faster electro-optic modulation rates may be obtained at the expense of optical power loss if sufficiently high-speed electronic drivers are available. Preferably, these conventional optical switches can be used for TDM purposes.

All-optical switching systems are an alternative for MWML-DWDM-TDM systems, and they are capable of switching at 5 psec or shorter time intervals. The terahertz optical asymmetric demultiplexer (TOAD) described in U.S. Pat. No. 5,493,433, is an example of the nonlinear optical loop mirror (NOLM) class of all-optical switches. As another example, K. Hall et al. of MIT Lincoln Laboratory has demonstrated similar alloptical switching techniques which are based on polarization switching phenomena but are otherwise analogous to the TOAD, as described in her paper CMA2, "Interferometric All-Optical Switching Using Nonlinearities in Semiconductor Optical Amplifiers Biased at Transparency" at the 1998 Conference on Lasers and Electro-Optics and published in the proceedings thereof by the Optical Society of America. While neither of these two groups demonstrated multi-wavelength switching of the type necessary to simultaneously switch many pulse streams, the present inventors have determined that it is possible to simultaneously switch pulses of multiple wavelengths through such nonlinear all-optical switches and such TDM switching devices may be used in a MWML-DWDM-TDM receiver in accordance with the invention.

Also, the TDM-type embodiment of FIG. 9 may also be used in a modified version of the embodiment of FIG. 5.

MWML-DWDM Optical Transmission Systems Using MWML-DWDM Optical Transmitters

Figure 11:
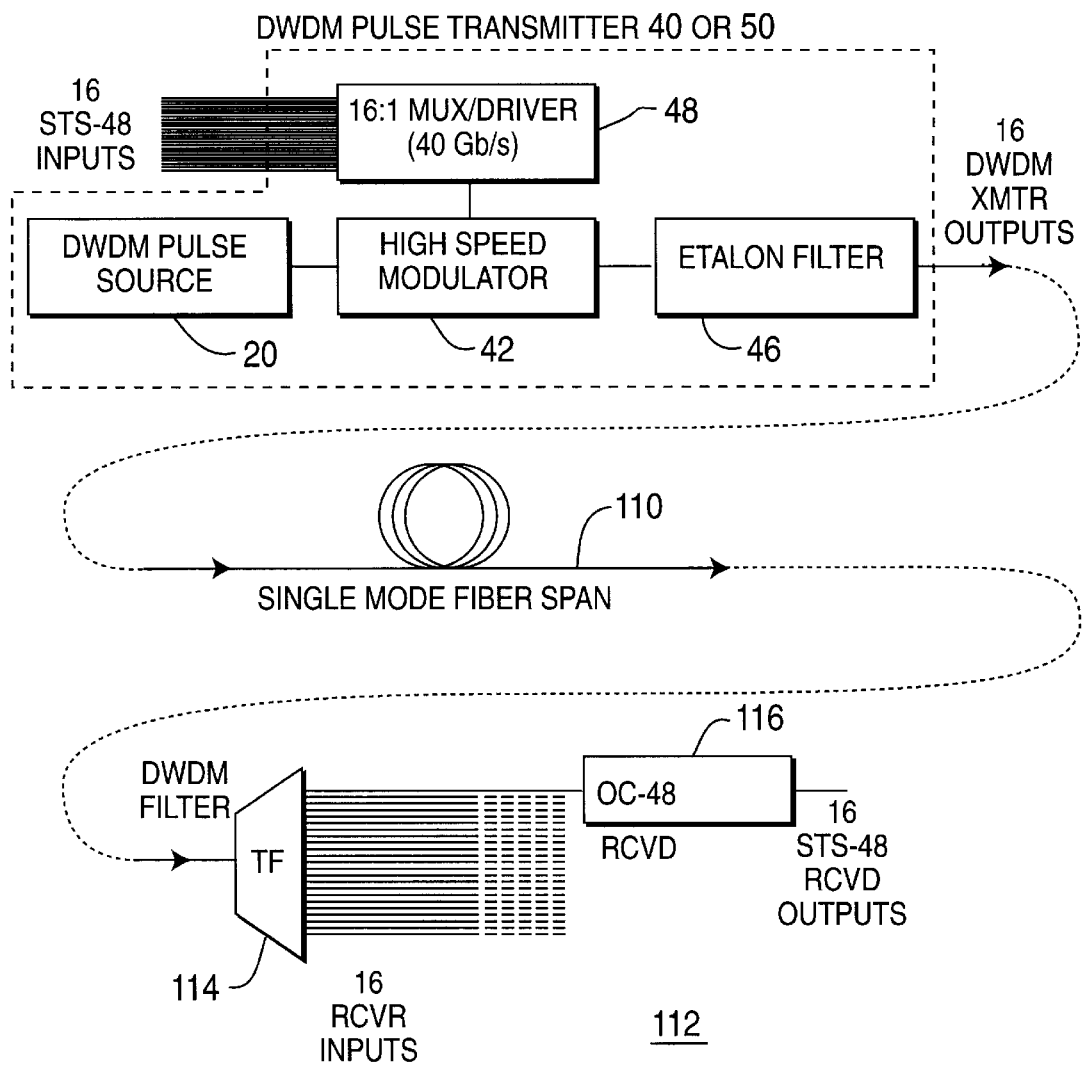
FIG. 11 is a schematic diagram of an embodiment of a MWML-DWDM optical transmission system using MWML-DWDM optical transmitters of the type illustrated in FIG. 4 and conventional optical receivers.

An example of a MWML-DWDM optical transmitter/receiver system using the MWML-DWDM optical transmitter of FIGS. 4 or 5 in accordance with the invention is shown schematically in FIG. 11. As illustrated, a MWML-DWDM transmission system in accordance with the invention includes a MWML-DWDM optical transmitter 40 or 50, a single mode fiber span 110, and a conventional DWDM optical receiver 112. As described above, the MWML-DWDM optical transmitter 40 or 50 preferably comprises a WORP-DWDM optical source 20, a high speed modulator 42 such as an electro-optic modulator, an optional etalon filter 46, and an ETDM/driver 48. In the illustrated SONET embodiment, the ETDM/driver 48 may be a 40 Gbit/sec 16:1 ETDM/driver which is responsive to 16 data inputs, such as STS-48 inputs. The DWDM SONET optical receiver 112, on the other hand, comprises a conventional DWDM filter 114, such as an arrayed waveguide grating (AWG) filter or an interference filter, which separates the DWDM optical data stream into its wavelength components for demodulation by 16 SONET receivers 116 which demodulate the optical data streams to provide 16 received electronic data stream outputs. In the example in FIG. 11, the inputs are SONET STS-48 electrical signals and the outputs are SONET STS-48 electrical signals which are transmitted in a SONET optical format over fiber 110. Although not shown in FIG. 11, appropriate control electronics/software, a craft interface, signaling systems, operations/administration/management systems, and electromechanical support are also provided. Of course, for a complete bi-directional transmission system, two links of the type illustrated in FIG. 11 would be required. Also, those skilled in the art will appreciate that systems with more or less than 16 wavelengths may be used.

Reception by MWML-DWDM pulsed optical receiver 112 of the DWDM signals generated by the MWML-DWDM optical transmitter 40 of the invention is in all respects similar to reception of standard WDM signals. This is because generated signals in a preferred embodiment are standard WDM signals, which use a RZ modulation scheme. However, an NRZ modulation scheme as described above could also be generated by the MWML-DWDM transmitter as desired.

Figure 12:
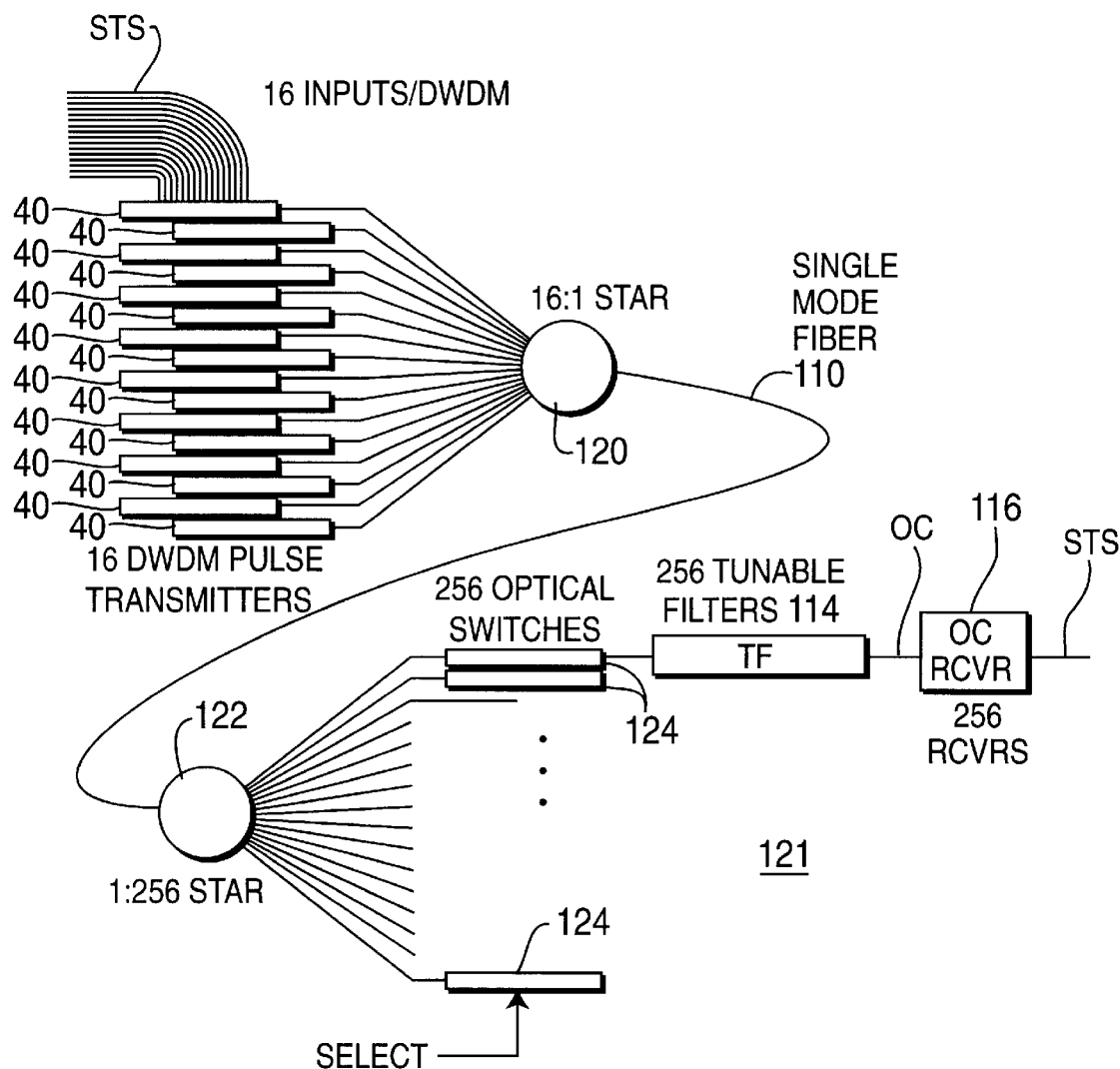
FIG. 12 is a schematic diagram of an embodiment of a MWML-DWDM-TDM optical transmission system including MWML-DWDM optical transmitters of the type illustrated in FIG. 9 and a MWML-DWDM-TDM receiver in accordance with the invention which separates the received signals by time and frequency.

MWML-DWDM-TDM Optical Transmission Systems Using MWML-DWDM-TDM Optical Transmitters An example of a MWML-DWDM-TDM pulsed optical transmitter/receiver system using the MWML-DWDM-TDM optical transmitter 90 (FIG. 9) in a SONET environment in accordance with the invention is illustrated in FIG. 12. In this embodiment, a conventional WDM receiver may not be used because of the TDM characteristics of the received signal. FIG. 12 illustrates a MWML-DWDM-TDM transmission system which includes 16 MWML-DWDM optical transmitters 40 with non-overlapping time shifted wavelength outputs, a 16:1 star combiner 120 which provides respective time slots for the non-overlapping time shifted pulses from the respective MWML-DWDM optical transmitters 40, a single-mode fiber span 110, and a MWML-DWDM-TDM optical receiver 121. In the embodiment of FIG. 12, after coding the data in MWML-DWDM transmitters 40, the MWML-DWDM-TDM format is impressed onto single optical fiber 110 by 16:1 star combiner 120 to provide a single data stream containing 256 channels (16 time slots by 16 wavelengths). In the example of each channel conveying 2.5 Gb/s digital optical data rates, such a system would convey 640 Gb/s of digital optical data. At the MWML-DWDM-TDM optical receiver 121, the single data stream is separated into 256 channels by 1:256 star optical separator 122, and each optical switch 124 selects a corresponding one of the 256 input channels by selecting the appropriate pulse-frame. The pulses in the selected pulse-frame are then provided to a corresponding DWDM filter 114, which may be a tunable filter, for tuning to the desired wavelength in the selected time slot or a fixed filter such as an arrayed waveguide grating (AWG) filter or other filter devices performing a similar function known to those skilled in the art, and pulses in the selected pulse-frame and the tuned frequency are provided to the corresponding optical receiver 116 for demodulation of the transmitted data As noted above, the optical switch 124 may be an electro-optic modulator or a nonlinear optical switch such as a TOAD device, or another device performing a similar function known to those skilled in the art.

The MWML-DWDM-TDM transmission technique of FIG. 12 provides a very good engineering trade-off between electronics and optics. The MWML-DWDM-TDM optical transmitters of FIG. 12 offer increased flexibility between electronics and optics due to the fact that TDM pulses are generated and that a TDM system approach may be used without the addition of TDM components on the transmitter side. While those skilled in the art will appreciate that the MWML-DWDM and MWML-DWDM-TDM optical transmitters of the invention do not offer any additional bandwidth to a single-mode fiber transmission system, those skilled in the art will appreciate that the techniques of the invention permit transmission of large quantities of data at a given rate to be achieved for a cheaper cost.

It is to be understood that the apparatus and method of operation taught herein are illustrative of the invention. Modifications may readily be devised by those skilled in the art without departing from the spirit or scope of the invention. For example, the optimum period of MWML pulses may be significantly longer than the rate required by the MWML-DWDM optical transmission system. In such a case, longer period pulses may be interleaved to achieve shorter periods by methods known to those skilled in the art. In addition, those skilled in the art will appreciate that a plurality of the MWML-DWDM and WMML-DWDM-TDM optical transmission systems described herein may be combined to include additional frequencies and/or pulse-frames. All such modifications are intended to be included within the scope of the appended claims.

We claim:

1. A wavelength ordered repetitive periodic dense wavelength division multiplexed (WORP-DWDM) optical source, comprising:

a multiwavelength mode-locked (MWML) laser source including a semiconductor optical amplifier (SOA) disposed in a cavity of said MWML laser source, said SOA being actively driven by a radio frequency (RF) signal and emitting periodic pulses within a plurality of discrete wavelength bands simultaneously at a port of said MWML laser source, where the RF signal oscillates at a frequency whereby one of said frequency and a sub-harmonic of said frequency substantially equals the inverse of the round trip travel time of pulses circulating within a cavity of said MWML laser source; and a temporal dispersion element which time shifts said plurality of wavelengths by differential wavelength-dependent delays so as to transform pulses emitted by said MWML laser source into a wavelength ordered repetitive periodic (WORP) sequence of optical pulses.

2. A WORP-DWDM optical source as in claim 1, wherein said MWML laser source comprises an angled-stripe SOA and a RF source which applies said RF signal to said SOA.

3. A WORP-DWDM optical source as in claim 1, wherein said temporal dispersion element comprises one of a temporal dispersion filter and a dispersive fiber grating.

4. A multi-wavelength mode-locked dense wavelength division multiplexed (MWML-DWDM) optical transmitter, comprising:

a multiwavelength mode-locked (MWML) laser source comprising a semiconductor optical amplifier (SOA) disposed in a cavity of said MWML laser source, said SOA being actively driven by a radio frequency (RF) signal and emitting periodic pulses within a plurality of discrete wavelength bands simultaneously at a port of said MWML laser source, where the RF signal oscillates at a frequency whereby one of said frequency and a sub-harmonic of said frequency substantially equals the inverse of the round trip travel time of pulses circulating within a cavity of said MWML laser source;

a temporal dispersion element which time shifts said plurality of wavelengths by differential wavelength-dependent delays so as to transform pulses emitted by said MWML laser source into a wavelength ordered repetitive periodic (WORP) sequence of optical pulses; and an optical modulator which modulates an electronic digital data stream onto individual wavelengths in said WORP sequence.

5. A MWML-DWDM optical transmitter as in claim 4, further comprising an optical amplifier which amplifies an output of said optical modulator.

6. A MWWL-DWDM optical transmitter as in claim 4, further comprising an etalon filter which filters an output of said optical modulator so as to narrow a spectrum of each individual wavelength from said optical modulator so as to mitigate wavelength dispersion and to lengthen pulses beyond the duration of their respective pulse-frames, where the pulse-frames are the time intervals allocated within a WORP pulse sequence to transmission of a single pulse.

7. A MWML-DWDM optical transmitter as in claim 4, further comprising a digital electronic time domain multiplexer (EDTM) which drives a multiplicity of discrete data signals into said optical modulator for modulation onto respective wavelengths in said WORP sequence.

8. A MWML-DWDM optical transmitter as in claim 7, wherein said ETDM receives a plurality of discrete data signals, combines said plurality of discrete data signals into an electronic digital data stream, and synchronizes said digital data stream to said WORP sequence so as to provide said discrete data signals on respective wavelengths in said WORP sequence.

9. A multi-wavelength mode-locked dense wavelength division multiplexed (MWML-DWDM) optical transmitter, comprising:

a multiwavelength mode-locked (MWML) laser source comprising a semiconductor optical amplifier (SOA) disposed in a cavity of said MWML laser source, said SOA being actively driven by a radio frequency (RF) signal and emitting periodic pulses within a plurality of discrete wavelength bands simultaneously at a port of said MWML laser source, where the RF signal oscillates at a frequency whereby one of said frequency and a sub-harmonic of said fundamental frequency substantially equals the inverse of the round trip travel time of pulses circulating within a cavity of said MWML laser source;

a temporal dispersion element which time shifts said plurality of wavelengths by differential wavelength-dependent delays so as to transform pulses emitted by said MWML laser source into a wavelength ordered repetitive periodic (WORP) sequence of optical pulses;

a wavelength selective splitter which splits said WORP sequence of optical pulses into at least two pulse sub-sequences, each pulse sub-sequence containing a subset of wavelengths generated by said MWML laser source;

an optical modulator for each pulse sub-sequence, each optical modulator modulating a digital data stream onto each individual wavelength in a pulse sub-sequence received by the optical modulator; and an optical combiner that combines an output from each of said optical modulators into a single multiwavelength aggregated optical data stream for transmission.

10. A MWML-DWDM optical transmitter as in claim 9, wherein each path of each separate pulse sub-sequence imposes a delay on said each pulse substream, whereby a timing of optical data substreams following combination of said outputs of said optical modulators by said optical combiner can be adjusted based on said delays.

11. A MWML-DWDM optical transmitter as in claim 9, further comprising a digital electronic time domain multiplexer (ETDM) which drives a multiplicity of discrete data signals into each of said optical modulators for modulation onto respective wavelengths in said WORP sequence.

12. A MWML-DWDM optical transmitter as in claim 11, wherein said ETDM receives a plurality of discrete data signals, combines said plurality of discrete data signals into an electronic digital data stream, and synchronizes said digital data stream to portions of said WORP optical pulse sequence applied to each of said optical modulators so as to provide said discrete data signals on respective wavelengths in said WORP sequence.

13. A MWML-DWDM optical transmitter as in claim 9, wherein said optical combiner combines said WORP sequences from each optical modulator in a time shifted temporal order such that a wavelength may be used by more than one optical modulator to transmit data so long as said wavelength is not used in the same pulse-frame, where the pulse frame is the time interval allocated within a WORP pulse sequence to transmission of a single pulse, by said more than one optical modulator.

14. A multi-wavelength mode-locked dense wavelength division multiplexed (MWML-DWDM) optical transmitter, comprising:

a plurality of multiwavelength lasers, each multiwavelength laser emitting pulses at a plurality of wavelengths simultaneously at a port of said multiwavelength laser;

a temporal dispersion element which time shifts said plurality of wavelengths by differential wavelength-dependent delays so as to transform pulses emitted by said multiwavelength lasers into a wavelength ordered repetitive periodic dense wavelength division multiplexed (WORP) sequences of optical pulses;

an optical modulator for each of said multiwavelength lasers, each optical modulator modulating a digital data stream onto each individual wavelength in said WORP sequence; and an optical combiner which combines WORP sequences from each optical modulator into a single optical data stream for transmission.

15. A MWML-DWDM optical transmitter as in claim 14, wherein each said multiwavelength laser is a multiwavelength mode-locked (MWML) laser source including a semiconductor optical amplifier (SOA) disposed a cavity of said MWML laser source, said SOA being actively driven by a radio frequency (RF) signal and emitting periodic pulses within a plurality of discrete wavelength bands simultaneously at a port of said MWML laser source, where the RF signal oscillates at a frequency whereby one of said frequency and a frequency sub-harmonic of said frequency substantially equals the inverse of the round trip travel time of pulses circulating within a cavity of said MWML laser source.

16. A MWML-DWDM optical transmitter as in claim 14, wherein said optical combiner combines said WORP sequences from each of said plurality of optical modulators in a time shifted temporal order such that a wavelength may be used by more than one optical modulator to transmit data so long as said wavelength is not used in the same pulse-frame by said more than one optical modulator.

17. A multi-wavelength mode-locked dense wavelength division multiplexed (MWML-DWDM) optical transmission system, comprising:

a MWML-DWDM optical transmitter comprising:
a multiwavelength mode-locked (MWML) laser source including a semiconductor optical amplifier (SOA) disposed in a cavity of said MWML laser source, said SOA being actively driven by a radio frequency (RF) signal and emitting periodic pulses within a plurality of discrete wavelength bands simultaneously at a port of said MWML laser source, where the RF signal oscillates at a frequency whereby one of said frequency and a sub-harmonic of said frequency substantially equals the inverse of the round trip travel time of pulses circulating within a cavity of said MWML laser source, a temporal dispersion element which time shifts said plurality of wavelengths by differential wavelength-dependent delays so as to transform pulses emitted by said MWML laser source into a wavelength ordered repetitive periodic (WORP) sequence of optical pulses, and an optical modulator which modulates a digital data stream onto individual wavelengths in said WORP sequence;

an optical fiber which transmits said WORP sequence; and a MWML-DWDM optical receiver comprising:
a DWDM filter which separates said WORP sequence into said plurality of wavelengths, and
a plurality of optical receivers which demodulate said digital data stream from each of said plurality of wavelengths.

18. A MWML-DWDM optical transmission system as in claim 17, wherein said MWML-DWDM optical transmitter further comprises a digital electronic time domain multiplexer (ETDM) which drives a multiplicity of discrete data signals into said optical modulator for modulation onto respective wavelengths in said WORP sequence.

19. A MWML-DWDM optical transmission system as in claim 18, herein said ETDM receives a plurality of discrete data signals, combines said plurality of iscrete data signals into an electronic digital data stream, and synchronizes said digital data stream to said WORP sequence so as to provide said discrete data signals on respective wavelengths in said WORP sequence.

20. A multi-wavelength mode-locked dense wavelength division multiplexed time-division multiplexed (MWML-DWDM-TDM) optical transmission system, comprising:
a MWML-DWDM optical transmitter comprising:
at least one multiwavelength laser emitting periodic pulses within a plurality of discrete wavelength bands simultaneously at a port of said multiwavelength laser,
a temporal dispersion element for each of said multiwavelength lasers, each temporal dispersion element time shifting said plurality of wavelengths by differential wavelength-dependent delays so as to transform pulses output by said multiwavelength laser into a wavelength ordered repetitive periodic (WORP) sequence of optical pulses,
an optical modulator for each of said multiwavelength lasers, each optical modulator modulating a digital data stream onto each individual wavelength in said WORP sequence, and
an optical combiner combines said WORP sequences from each optical modulator in a time shifted temporal order such that a wavelength may be used by more than one optical modulator to transmit data so long as said wavelength is not used in the same pulse-frame, where the pulse frame is the time interval allocated within a WORP pulse sequence to transmission of a single pulse, by said more than one optical modulator;
an optical fiber which transmits said combined WORP sequences; and
a MWML-DWDM-TDM optical receiver comprising:
a plurality of optical pulse-frame selectors which select optical data from at least one of a plurality of wavelengths in a particular optical pulse-frame in a received combined WORP sequence,
a plurality of DWDM filters, each DWDM filter separating the combined WORP sequences in at least one optical pulse-frame into said plurality of wavelengths, and
a plurality of optical receivers which demodulate said optical digital data streams to obtain electronic digital data streams.

21. A MWML-DWDM optical transmitter as in claim 20, wherein each said multiwavelength laser is a multiwavelength mode-locked (MWML) laser source including a semiconductor optical amplifier (SOA) disposed in a cavity of said MWML laser source, said SOA being actively driven by a radio frequency (RF) signal and emitting periodic pulses within a plurality of discrete wavelength bands simultaneously at a port of said MWML laser source, where the RF signal oscillates at a frequency whereby one of said frequency and a sub-harmonic of said frequency substantially equals the inverse of the round trip travel time of pulses circulating within a cavity of said MWML laser source.

22. A MWML-DWDM optical transmitter as in claim 20, wherein said pulse-frame selector comprises a plurality of optical switches which select respective pulse-frames and provide optical data in said respective pulse-frames for demodulation by a corresponding optical receiver.

23. A multi-wavelength mode-locked dense wavelength division multiplexed (MWML-DWDM) optical transmission method, comprising the steps of:
generating light emission by a multiwavelength laser, said light emission including periodic pulses emitted within a plurality of discrete wavelength bands simultaneously at an output of said multiwavelength laser;
time shifting pulses in said discrete wavelength bands by differential wavelength-dependent delays so as to transform pulses emitted by said multiwavelength laser into a wavelength ordered repetitive periodic (WORP) sequence; and
modulating a digital data stream onto each individual wavelength in said WORP sequence for transmission.

24. A MWML-DWDM optical transmission method as in claim 23, wherein said modulating step comprises the steps of receiving a plurality of discrete data signals, combining said plurality of discrete data signals into an electronic digital data stream, and synchronizing said digital data stream to said WORP sequence so as to provide said discrete data signals on respective wavelengths in said WORP sequence.

25. A MWML-DWDM optical transmission method as in claim 23, comprising the further step of filtering the modulated WORP sequence so as to narrow a spectrum of each individual wavelength and to mitigate wavelength dispersion and to lengthen the duration of optical pulses beyond the pulse-frame, where the pulse frame is the time interval allocated within a WORP pulse sequence to transmission of a single pulse.

26. A MWML-DWDM optical transmission method as in claim 23, wherein said modulating step comprises the steps of splitting said WORP sequence into at least two pulse sub-sequences, modulating each individual wavelength in each of said pulse sub-sequences with an optical data stream in a separate data modulator for each said pulse sub-sequences, and combining an output from each separate data modulator into a single optical data stream for transmission.

27. A MWML-DWDM optical transmission method as in claim 23, comprising the further steps of transmitting said modulated WORP sequence, separating said modulated WORP sequence into said plurality of wavelengths at a receiver, and demodulating said digital data stream from said plurality of wavelengths at said receiver.

28. A MWML-DWDM optical transmission method as in claim 23, comprising the further step of combining said WORP sequences in a time shifted temporal order such that a wavelength may be used by more than one optical modulator to transmit data so long as said wavelength is not used in the same pulse-frame, where the pulse frame is the time interval allocated within a WORP pulse sequence to transmission of a single pulse, by said more than one optical modulator.

29. A MWML-DWDM optical transmission method as in claim 28, comprising the further steps of transmitting said WORP sequence, selecting optical data from at least one of a plurality of wavelengths in a particular optical pulse-frame in the received combined WORP sequences, separating the modulated combined WORP sequences in at least one optical pulse-frame into said plurality of wavelengths, and demodulating the digital data stream.

* * * * *